United States Patent
Akarvardar

(12) 
(10) Patent No.: US 9,601,383 B1
(45) Date of Patent: Mar. 21, 2017

(54) FINFET FABRICATION BY FORMING ISOLATION TRENCHES PRIOR TO FIN FORMATION

(71) Applicant: GLOBALFOUNDRIES Inc., Grand Cayman (KY)

(72) Inventor: Murat Kerem Akarvardar, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/941,885

(22) Filed: Nov. 16, 2015

(51) Int. Cl.
   *H01L 21/337* (2006.01)
   *H01L 21/8234* (2006.01)
   *H01L 21/762* (2006.01)
   *H01L 21/308* (2006.01)
   *H01L 21/3105* (2006.01)
   *H01L 21/02* (2006.01)
   *H01L 27/088* (2006.01)
   *H01L 29/161* (2006.01)
   *H01L 29/06* (2006.01)

(52) U.S. Cl.
   CPC ............... *H01L 21/823431* (2013.01); *H01L 21/02532* (2013.01); *H01L 21/02598* (2013.01); *H01L 21/02636* (2013.01); *H01L 21/308* (2013.01); *H01L 21/31051* (2013.01); *H01L 21/76224* (2013.01); *H01L 21/823481* (2013.01); *H01L 27/0886* (2013.01); *H01L 29/0649* (2013.01); *H01L 29/161* (2013.01)

(58) Field of Classification Search
   CPC ............... H01L 21/823418–21/823431; H01L 21/823814–21/823821; H01L 21/845; H01L 27/0886–27/0924; H01L 27/10826; H01L 27/10879; H01L 27/1211; H01L 29/41791; H01L 29/66772; H01L 29/66795
   See application file for complete search history.

(56) References Cited

U.S. PATENT DOCUMENTS

| 2008/0029821 A1* | 2/2008 | Yamagami | H01L 21/823807 257/365 |
| 2015/0249087 A1* | 9/2015 | Cantoro | H01L 27/0924 257/369 |

\* cited by examiner

*Primary Examiner* — Cuong B Nguyen
(74) *Attorney, Agent, or Firm* — Wayne F. Reinke, Esq.; Heslin Rothenberg Farley & Mesiti P.C.

(57) ABSTRACT

A semiconductor structure for a FinFET in fabrication is provided, the structure including a bulk semiconductor substrate initially with a hard mask over the substrate. Isolation trenches between regions of the structure where the fins will be are formed prior to the fins, and filled with selectively removable sacrificial isolation material. Remains of the hard mask are removed and another hard mask formed over the structure with filled isolation trenches. Fins are then formed throughout the structure, including the regions of sacrificial isolation material, which is thereafter selectively removed.

20 Claims, 3 Drawing Sheets

Pages 1-2 …

FINFET FABRICATION BY FORMING ISOLATION TRENCHES PRIOR TO FIN FORMATION

BACKGROUND OF THE INVENTION

Technical Field

The present invention generally relates to FinFET fabrication. More particularly, the present invention relates to forming isolation trenches prior to fins in FinFET fabrication and the resulting semiconductor structures.

Background Information

In conventional FinFET formation, fins are formed prior to isolation trenches. This fabrication flow results in several negative consequences. For example, the conventional flow results in separate isolation fill/planarization procedures for the fins and the isolation trenches. As another example, if a protective liner is formed right after fin formation, its effectiveness will be lost at fin ends during isolation trench formation.

Thus, a need continues to exist for a more efficient process of FinFET fabrication.

SUMMARY OF THE INVENTION

The shortcomings of the prior art are overcome and additional advantages are provided through the provision, in one aspect, of a method of FinFET fabrication. The method includes providing a starting semiconductor structure, the starting semiconductor structure including a bulk semiconductor substrate and a first hard mask over the semiconductor substrate, and forming isolation trenches in the starting semiconductor structure prior to fin formation.

In accordance with another aspect, a semiconductor structure is provided. The semiconductor structure includes a starting FinFET structure, including a bulk semiconductor substrate and a hard mask over the semiconductor substrate, and isolation trenches in the starting FinFET structure separating active device regions.

In accordance with yet another aspect, a semiconductor structure is provided. The semiconductor structure includes a semiconductor substrate having trenches therein filled with a sacrificial isolation material that is selectively removable, and fins coupled to the substrate and to the sacrificial isolation material, the fins coupled to the substrate include semiconductor material and the fins coupled to the sacrificial isolation material include the sacrificial isolation material.

These, and other objects, features and advantages of this invention will become apparent from the following detailed description of the various aspects of the invention taken in conjunction with the accompanying drawings.

DETAILED DESCRIPTION OF THE INVENTION

Figure 1:
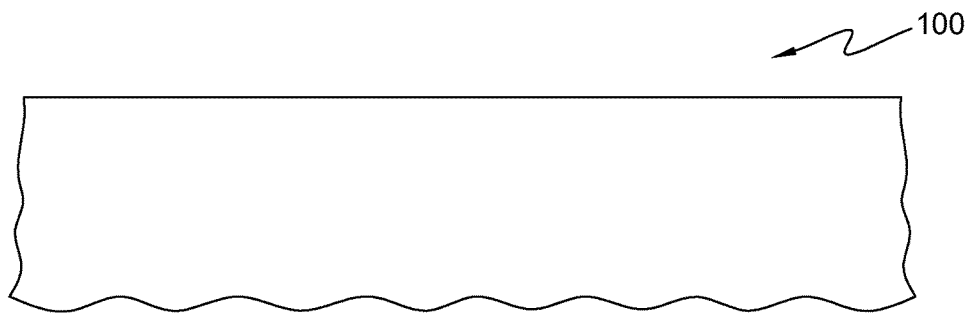
FIG. 1 is a cross-sectional view of one example a starting structure, including a bulk semiconductor substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure, including a bulk semiconductor substrate 100, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, the bulk substrate is larger.

In one example, substrate 100 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 100 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
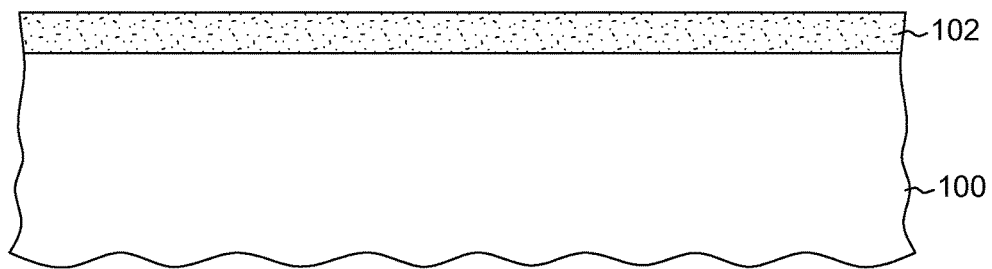
FIG. 2 depicts one example of the substrate of FIG. 1 after depositing an oxide or nitride hard mask over the substrate, in accordance with one or more aspects of the present invention.

FIG. 2 depicts one example of the substrate of FIG. 1 after formation of a hard mask 102 over the substrate, in accordance with one or more aspects of the present invention. In one example, hard mask material is silicon nitride.

Figure 3:
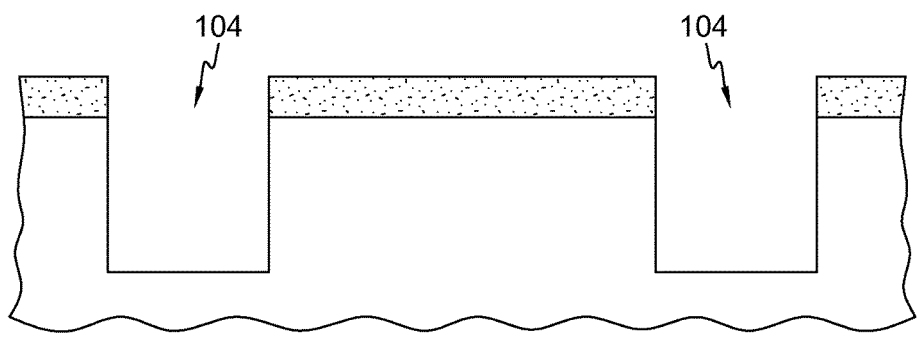
FIG. 3 depicts one example of the structure of FIG. 2 after forming isolation trenches therein, in accordance with one or more aspects of the present invention.

FIG. 3 depicts one example of the structure of FIG. 2 after forming isolation trenches 104 therein, in accordance with one or more aspects of the present invention. In one example, the isolation trenches may be formed by patterning and etching (e.g., reactive ion etching), which may allow for perfectly or near perfectly sharp sidewalls, which may simplify the "fin cut" process, in particular, single fin removal and single fin preservation downstream in the fabrication process.

Figure 4:
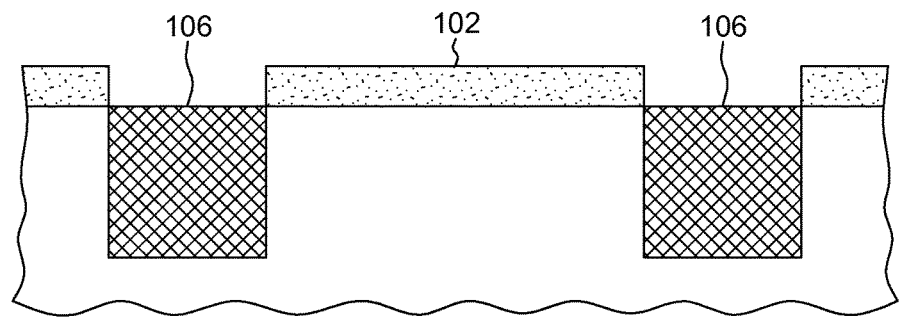
FIG. 4 depicts one example of the structure of FIG. 3 after filling the isolation trenches with a sacrificial isolation material, in accordance with one or more aspects of the present invention.

FIG. 4 depicts one example of the structure of FIG. 3 after filling the isolation trenches (104, FIG. 3) with a sacrificial isolation material 106, in accordance with one or more aspects of the present invention. In one example, the isolation trenches may be over filled with the sacrificial isolation material, followed by a planarization process (e.g., a chemical-mechanical polishing process (CMP)) and recess to be level with the hard mask 102, and sacrificial material timed recess to make it coplanar with the substrate.

The sacrificial isolation material can be anything that can be removed selective to the semiconductor substrate (e.g., silicon). Possibilities include amorphous materials (e.g., Si, SiGe, $SiO_2$ . . . ) with overfill, CMP and recess. However, benefits are realized when the isolation material includes, for example, selectively removable single crystal epitaxial silicon germanium having more than about 30% germanium. The benefits include enabling the use of a "flush fill" process without using a CMP and recess process, and providing excellent gap fill with no seams or voids.

Figure 5:
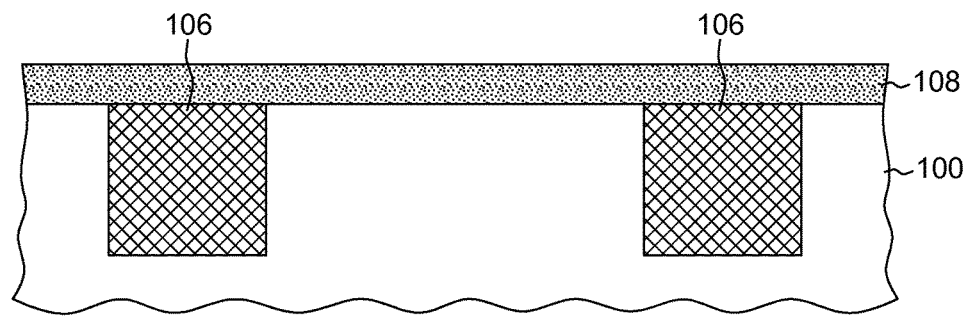
FIG. 5 depicts one example of the structure of FIG. 4 after removal of remaining portions of the hard mask and formation of another blanket layer of hard mask over the substrate and the sacrificial isolation material, in accordance with one or more aspects of the present invention.

FIG. 5 depicts one example of the structure of FIG. 4 after removal of remaining portions of the layer of hard mask (102, FIG. 4) and formation of another blanket layer of hard mask 108 (e.g., silicon nitride) over the substrate 100 and the sacrificial isolation material 106, in accordance with one or more aspects of the present invention.

Figure 6:
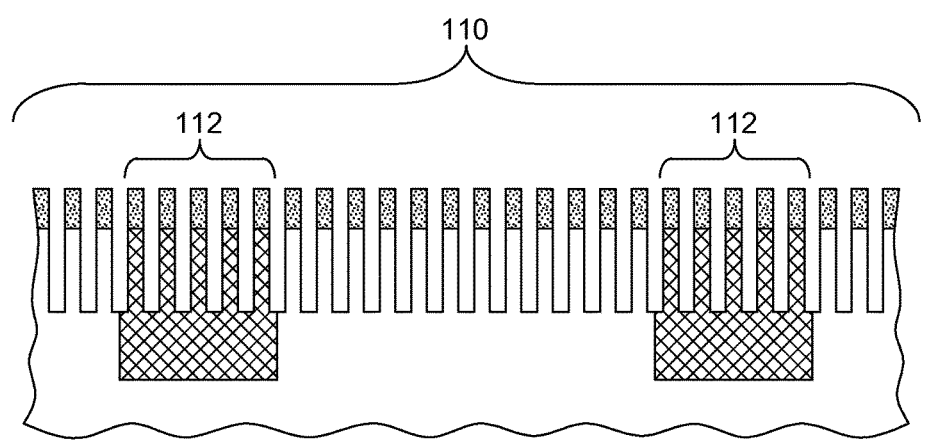
FIG. 6 depicts one example of the structure of FIG. 5 after formation of fins everywhere, including fins made of the sacrificial isolation material, in accordance with one or more aspects of the present invention.

FIG. 6 depicts one example of the structure of FIG. 5 after formation of fins 110 everywhere, including in the region(s) of sacrificial isolation material (e.g., fins 112), in accordance with one or more aspects of the present invention. In one example, the fins are formed using a sidewall image transfer technique. Because fins were formed everywhere on the semiconductor die, this technique allows for excellent fin profile uniformity.

Figure 7:
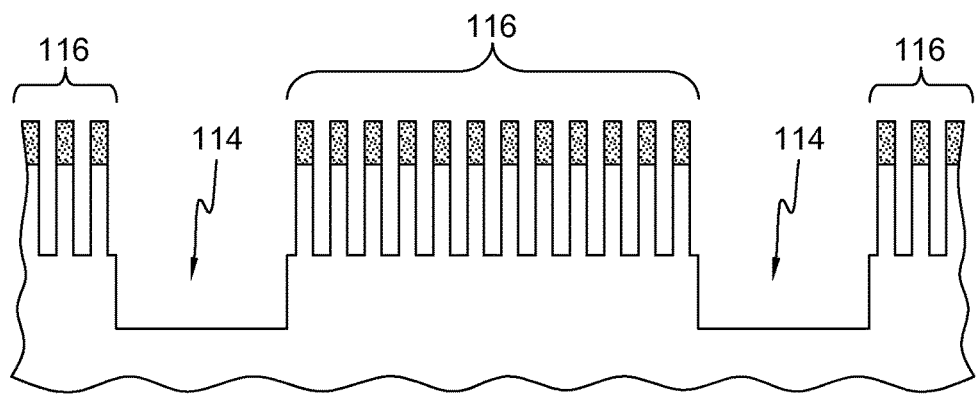
FIG. 7 depicts one example of the structure of FIG. 6 after selective removal of the fins made of sacrificial isolation material, leaving empty isolation trenches, in accordance with one or more aspects of the present invention.

FIG. 7 depicts one example of the structure of FIG. 6 after selective isotropic removal of the fins 112 and sacrificial isolation material 106 in the isolation trenches, leaving empty isolation trenches 114, in accordance with one or more aspects of the present invention. Note that this removal process does not employ a lithography step to protect fins 116.

Selective removal of the sacrificial isolation material may be accomplished, for example, using hydrochloride vapor where the sacrificial isolation material includes epitaxial silicon germanium with more than about 30% germanium. Note that in the fabrication process after the FIG. 7 structure is realized, if a protective fin liner is used, it will also protect the ends of the fins, which is not possible in a conventional "fin-first, isolation last" fabrication process.

Figure 8:
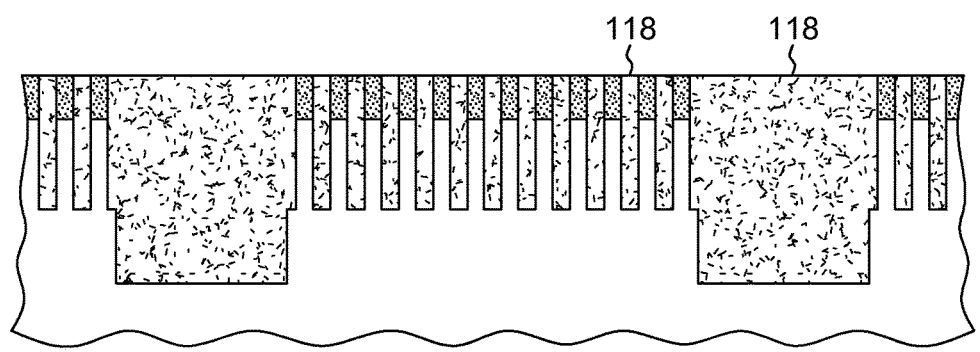
FIG. 8 depicts one example of the structure of FIG. 7 after commonly filling the isolation trenches and between remaining fins with isolation material, in accordance with one or more aspects of the present invention.

FIG. 8 depicts one example of the structure of FIG. 7 after commonly filling the isolation trenches 114 and between remaining fins 116 with isolation material 118 such as a HARP or flowable oxide, in accordance with one or more aspects of the present invention. In one example, an overfill of the isolation material is performed, followed by a planarization process (e.g., CMP process).

In a first aspect, disclosed above is a method. The method includes providing a starting semiconductor structure, the starting semiconductor structure including a bulk semiconductor substrate and a first hard mask over the semiconductor substrate, and forming isolation trenches in the starting semiconductor structure prior to fin formation.

In one example, the method may further include, for example, filling the isolation trenches with sacrificial isolation material that is selectively removable, replacing remaining portions of the first hard mask with a second hard mask, resulting in an intermediate structure, forming fins everywhere in the intermediate structure, and selectively removing the sacrificial isolation material.

In one example, the sacrificial isolation material may include, for example, a material other than epitaxial silicon germanium, and filling the isolation trenches with the sacrificial isolation material may include, for example, overfilling the isolation trenches with the sacrificial isolation material, planarizing the sacrificial isolation material down to a top surface of the hard mask and recessing the sacrificial isolation material down to a top surface of the substrate.

In one example, where the sacrificial isolation material has been selectively removed, filling the isolation trenches with sacrificial isolation material may include, for example, selective growth of epitaxial semiconductor material in the isolation trenches. In one example, the epitaxial semiconductor material may include, for example, single crystal epitaxial silicon germanium having greater than 30% germanium.

In one example, where the sacrificial isolation material has been selectively removed, the method may further include, for example, a common isolation fill for the isolation trenches and between the fins.

In another example, where the sacrificial isolation material has been selectively removed, the method may further include, for example, after the selectively removing, forming a liner around each fin.

In one example, where a liner is used, the sacrificial isolation material may include for example, a material other than epitaxial silicon germanium, and filling the isolation trenches with the sacrificial isolation material may include, for example, overfilling the isolation trenches with the sacrificial isolation material, planarizing the sacrificial isolation material down to a top surface of the hard mask and recessing the sacrificial isolation material down to a top surface of the substrate.

In another example, where a liner is used, filling the isolation trenches with sacrificial isolation material may include, for example, selective growth of epitaxial semiconductor material in the isolation trenches. In one example, the selectively grown epitaxial semiconductor material may include, for example, single crystal epitaxial silicon germanium having greater than 30% germanium.

In still another example, where a liner is used, the method may further include, for example, filling between the fins with isolation material simultaneously with filling the isolation trenches.

In one example, where the sacrificial isolation material has been selectively removed, forming the isolation trenches may include, for example, patterning and etching the starting semiconductor structure, and selectively removing the sacrificial isolation material may include, for example, single-fin removal or preservation.

In a second aspect, disclosed above is a semiconductor structure. The semiconductor structure includes a starting FinFET structure, including a bulk semiconductor substrate and a hard mask over the semiconductor substrate, and isolation trenches in the starting FinFET structure separating regions where fins will be.

In one example, the isolation trenches may be, for example, filled with sacrificial isolation material that is removable selective to the substrate and the regions where fins will be. In one example, the sacrificial isolation material may include, for example, selectively grown epitaxial semiconductor material. In one example, the epitaxial semiconductor material may include, for example, single crystal epitaxial silicon germanium having greater than 30% germanium.

In a third aspect, disclosed above is a semiconductor structure. The semiconductor structure includes a semiconductor substrate having trenches therein filled with a sacrificial isolation material that is selectively removable, and fins coupled to the substrate and to the sacrificial isolation material, the fins coupled to the substrate include semiconductor material and the fins coupled to the sacrificial isolation material include the sacrificial isolation material.

In one example, the semiconductor structure may further include, for example, a hard mask on a top surface of each fin.

In one example, the sacrificial isolation material of the semiconductor structure of the third aspect may include, for example, an epitaxial semiconductor material. In one example, the epitaxial semiconductor material may include, for example, selectively grown epitaxial silicon germanium with greater than 30% germanium.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the starting semiconductor structure comprising a bulk semiconductor substrate and a first hard mask over the semiconductor substrate;
removing portions of the first hard mask;
forming isolation trenches in the starting semiconductor structure prior to fin formation;
filling the isolation trenches with sacrificial isolation material that is selectively removable;
removing remaining portions of the first hard mask and replacing with a blanket second hard mask, resulting in an intermediate structure;
after the removing and the replacing, forming in the intermediate structure semiconductor fins and fins in the sacrificial isolation material; and
selectively removing the remaining sacrificial isolation material.

2. The method of claim 1, wherein filling the isolation trenches with sacrificial isolation material comprises selective growth of epitaxial semiconductor material in the isolation trenches.

3. The method of claim 2, wherein the epitaxial semiconductor material comprises single crystal epitaxial silicon germanium having greater than 30% germanium.

4. The method of claim 1, further comprising commonly filling with isolation material between the fins and in the isolation trenches.

5. The method of claim 1, further comprising, after the selectively removing, forming a liner around each fin.

6. The method of claim 5, wherein the sacrificial isolation material comprises a material other than epitaxial silicon germanium, and wherein filling the isolation trenches with the sacrificial isolation material comprises:
overfilling the isolation trenches with the sacrificial isolation material;

planarizing the sacrificial isolation material down to a top surface of the second hard mask; and recessing the sacrificial isolation material down to top surface of the substrate.

7. The method of claim 5, wherein filling the isolation trenches with sacrificial isolation material comprises selective growth of epitaxial semiconductor material in the isolation trenches.

8. The method of claim 7, wherein the epitaxial semiconductor material comprises single crystal epitaxial silicon germanium having greater than 30% germanium.

9. The method of claim 5, further comprising commonly filling with isolation material between the fins and in the isolation trenches.

10. The method of claim 1, wherein forming the isolation trenches comprises patterning and etching the starting semiconductor structure, and wherein selectively removing the remaining sacrificial isolation material comprises single-fin removal.

11. A method, comprising:

providing a starting semiconductor structure, the starting semiconductor structure comprising a bulk semiconductor substrate and a first hard mask over the semiconductor substrate;

removing portions of the first hard mask;

forming isolation trenches in the starting semiconductor structure prior to fin formation;

filling the isolation trenches with sacrificial isolation material that is selectively removable;

removing remaining portions of the first hard mask and replacing with a blanket second hard mask, resulting in an intermediate structure;

after the removing and the replacing, forming in the intermediate structure semiconductor fins and fins in the sacrificial isolation material; and selectively removing the remaining sacrificial isolation material;

wherein the sacrificial isolation material comprises a material other than epitaxial silicon germanium, and wherein filling the isolation trenches with the sacrificial isolation material comprises:

overfilling the isolation trenches with the sacrificial isolation material;

planarizing the sacrificial isolation material down to a top surface of the second hard mask; and recessing the sacrificial isolation material down to top surface of the substrate.

12. The method of claim 11, wherein filling the isolation trenches with sacrificial isolation material comprises selective growth of epitaxial semiconductor material in the isolation trenches.

13. The method of claim 12, wherein the epitaxial semiconductor material comprises single crystal epitaxial silicon germanium having greater than 30% germanium.

14. The method of claim 11, further comprising commonly filling with isolation material between the fins and in the isolation trenches.

15. The method of claim 11, further comprising, after the selectively removing, forming a liner around each fin.

16. The method of claim 15, wherein the sacrificial isolation material comprises a material other than epitaxial silicon germanium, and wherein filling the isolation trenches with the sacrificial isolation material comprises:

overfilling the isolation trenches with the sacrificial isolation material;

planarizing the sacrificial isolation material down to a top surface of the second hard mask; and recessing the sacrificial isolation material down to top surface of the substrate.

17. The method of claim 15, wherein filling the isolation trenches with sacrificial isolation material comprises selective growth of epitaxial semiconductor material in the isolation trenches.

18. The method of claim 17, wherein the epitaxial semiconductor material comprises single crystal epitaxial silicon germanium having greater than 30% germanium.

19. The method of claim 15, further comprising commonly filling with isolation material between the fins and in the isolation trenches.

20. The method of claim 11, wherein forming the isolation trenches comprises patterning and etching the starting semiconductor structure, and wherein selectively removing the remaining sacrificial isolation material comprises single-fin removal.

* * * * *